(12) United States Patent
Domes

(10) Patent No.: US 8,441,128 B2
(45) Date of Patent: May 14, 2013

(54) SEMICONDUCTOR ARRANGEMENT

(75) Inventor: Daniel Domes, Ruethen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/210,453

(22) Filed: Aug. 16, 2011

(65) Prior Publication Data

US 2013/0043593 A1  Feb. 21, 2013

(51) Int. Cl.
*H01L 23/36* (2006.01)
*H03K 17/56* (2006.01)

(52) U.S. Cl.
USPC ............ 257/758; 257/E23.101; 257/E29.197; 257/E23.012; 257/E23.083; 257/E29.019; 257/E23.062; 257/E23.078; 257/712; 257/197; 257/724; 257/544; 257/138; 257/723; 257/700; 363/71; 363/125; 363/21.02; 327/419; 327/427; 327/436; 327/437; 327/530; 327/430; 327/434; 327/377

(58) Field of Classification Search ................ 257/758, 257/712, E23.101, E29.197, 684, 724, 727, 257/E23.012, E23.083, 544, E29.019, 700, 257/685, 723, 138, E23.062, E23.078; 363/71, 363/125, 21.02; 327/419, 427, 436, 437, 327/530, 430, 434, 377
See application file for complete search history.

(56) References Cited

U.S. PATENT DOCUMENTS

| | | | | |
|---|---|---|---|---|
| 8,228,113 | B2* | 7/2012 | Domes | 327/427 |
| 8,237,260 | B2* | 8/2012 | Tschirbs | 257/700 |
| 2008/0224547 | A1* | 9/2008 | Pastorina et al. | 307/130 |
| 2009/0016088 | A1* | 1/2009 | Bayerer et al. | 363/125 |
| 2009/0154200 | A1* | 6/2009 | Coccia et al. | 363/21.02 |
| 2010/0078764 | A1* | 4/2010 | Gietler et al. | 257/544 |
| 2010/0127371 | A1* | 5/2010 | Tschirbs | 257/684 |
| 2010/0328833 | A1* | 12/2010 | Frisch et al. | 361/111 |
| 2011/0102054 | A1* | 5/2011 | Domes | 327/419 |
| 2011/0215858 | A1* | 9/2011 | Mauder et al. | 327/377 |
| 2011/0216561 | A1* | 9/2011 | Bayerer et al. | 363/71 |
| 2012/0105131 | A1* | 5/2012 | Biela et al. | 327/430 |

* cited by examiner

*Primary Examiner* — A O Williams
(74) *Attorney, Agent, or Firm* — Murphy, Bilak & Homiller, PLLC

(57) ABSTRACT

A semiconductor arrangement includes a circuit carrier, bonding wire and at least N half bridge circuits. The circuit carrier includes a first metallization layer, a second metallization layer, an intermediate metallization layer arranged between the first metallization layer and the second metallization layer, a first insulation layer arranged between the intermediate metallization layer and the second metallization layer, and a second insulation layer arranged between the first metallization layer and the intermediate metallization layer. Each half bridge circuit includes a controllable first semiconductor switch and a controllable second semiconductor switch. The first semiconductor switch and the second semiconductor switch of each half bridge circuit are arranged on that side of the first metallization layer of the circuit carrier facing away from the second insulation layer. The bonding wire is directly bonded to the intermediate metallization layer of the circuit carrier at a first bonding location.

26 Claims, 4 Drawing Sheets

N = 1

N = 1

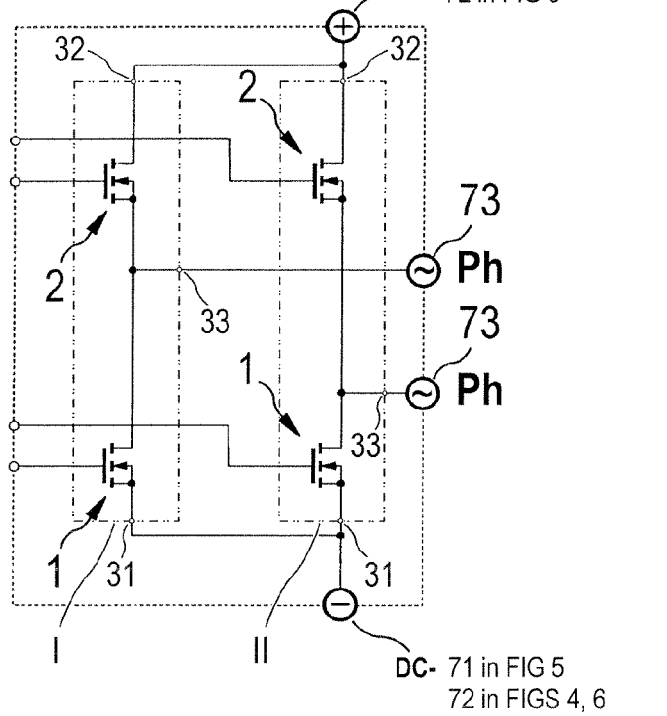
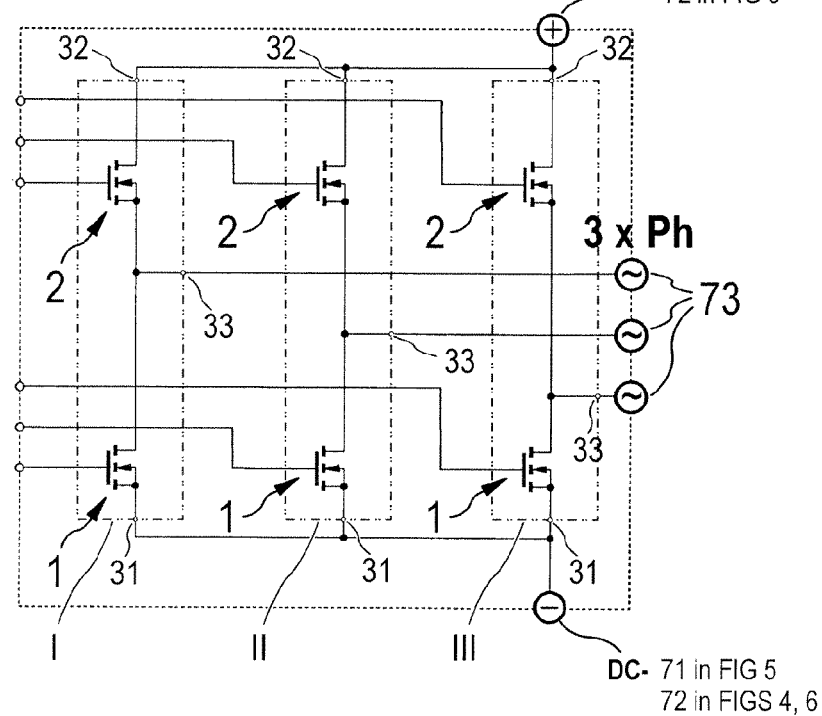

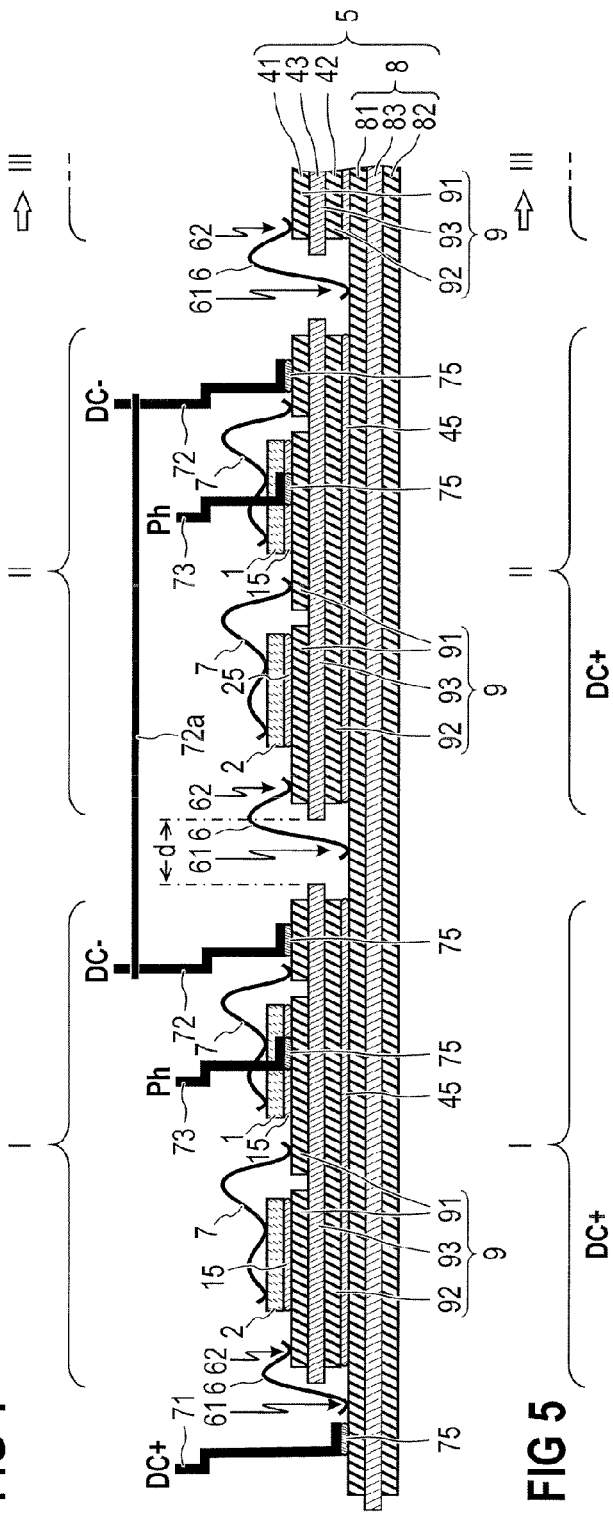
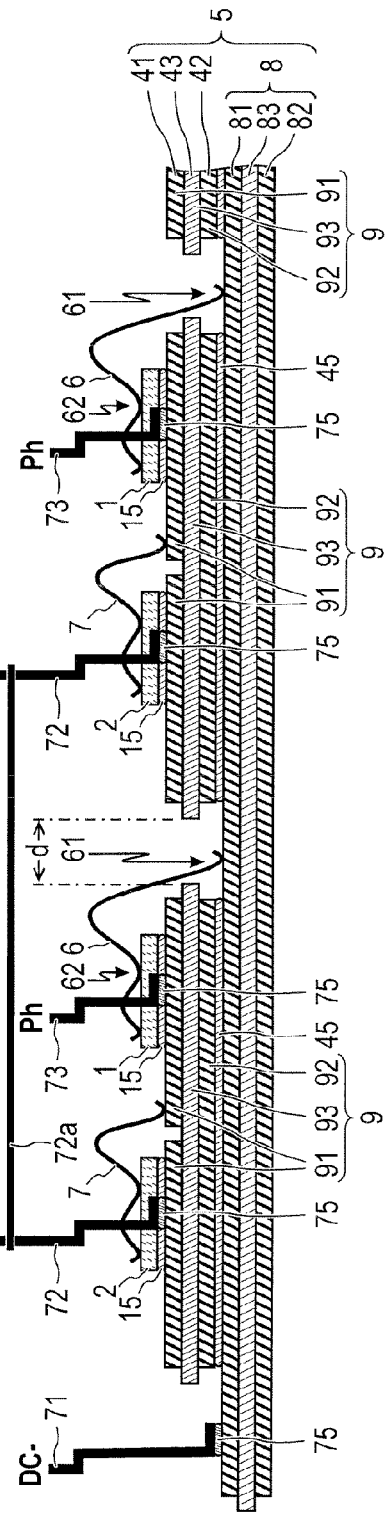

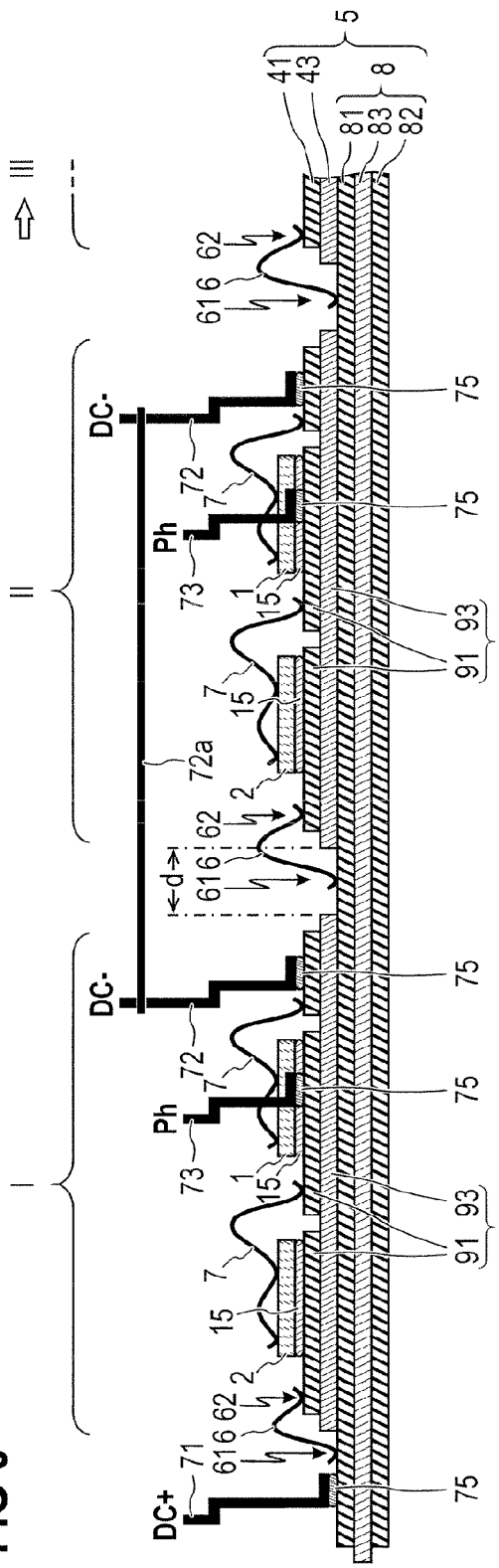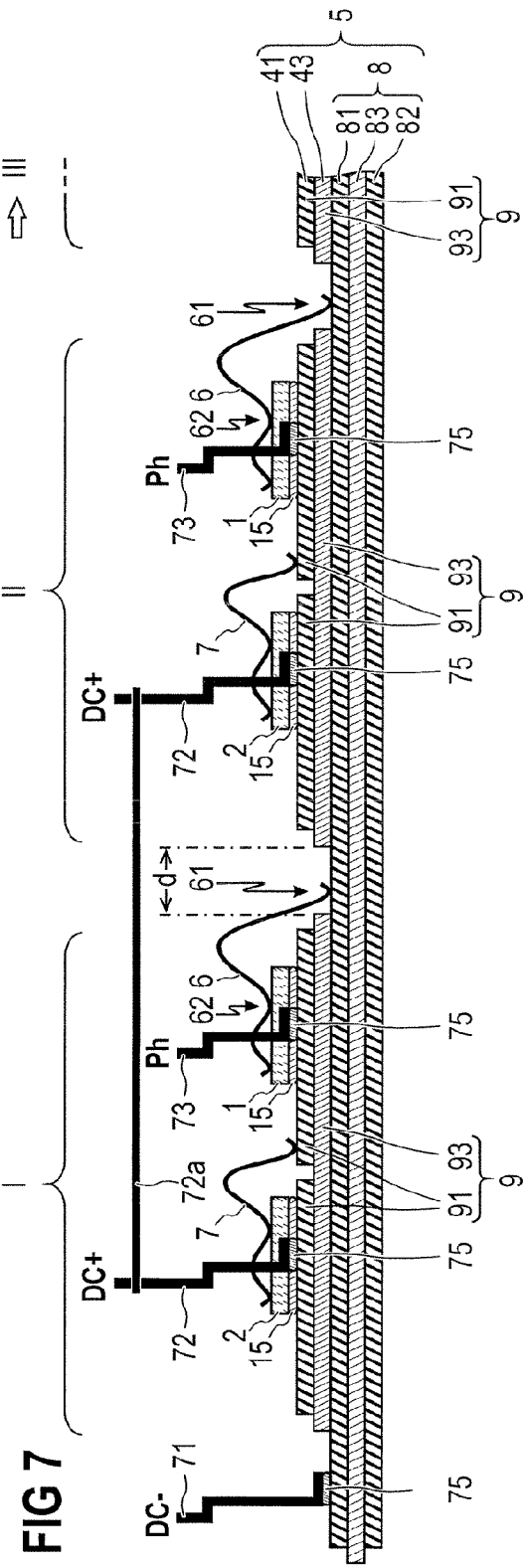

SEMICONDUCTOR ARRANGEMENT

TECHNICAL FIELD

Embodiments of the present application relate to semiconductor arrangements.

BACKGROUND

In many semiconductor arrangements, two semiconductor switches are connected in series thereby forming a half bridge. One, two, three or more of such half bridges can be used in power supplies for motors, in rectifiers, power converters etc.

In a half bridge, at least two controllable power semiconductor switches are connected in series. Between the two controllable power semiconductor switches, the series connection includes a circuit node. During operation, the series connection is connected to a supply voltage between a positive and a negative supply potential. The power semiconductor switch that is electrically connected to the negative supply potential is often referred to as "low side switch". Accordingly, the power semiconductor switch that is electrically connected to the positive supply potential is often referred to as "high side switch". During operation, the voltage at the circuit node alternates between two potentials which are substantially identical with the positive and negative supply potential.

In many conventional semiconductor arrangements, metallized ceramic substrates are used to realize at least some of the electrical connections of the arrangement. The power semiconductor switches are arranged on the top side of the substrate. The bottom side may be thermally and electrically coupled to a heat sink. In conjunction with the isolating ceramic, the metallizations of the ceramic substrates form a capacitance relative to a ground potential which is applied to the heat sink. Depending on the amplitude and frequency of the alternating voltage at the circuit node, displacement currents occur that continuously charge and discharge that capacitance. Due to displacement currents in unavoidable inductivities of the arrangement, voltage drops over such inductivities may cause undesired EMI (electromagnetic interference).

In order to reduce the inductivities, the ceramic substrates may be designed as multilayer substrates with vias that electrically interconnect different metal layers of the substrate. The vias allow for short electrical connections with reduced impedance. However, ceramic multilayer substrates having vias in the ceramic are quite expensive.

Therefore, there is a need for a semiconductor arrangement having a low inductivity even without such vias in the ceramic.

SUMMARY

According to one aspect, a semiconductor arrangement includes a circuit carrier, a bonding wire and at least N half bridge circuits. N is an integer that amounts to at least 1. The circuit carrier includes a first metallization layer, a second metallization layer, an intermediate metallization layer arranged between the first metallization layer and the second metallization layer, a first insulation layer arranged between the intermediate metallization layer and the second metallization layer, and a second insulation layer arranged between the first metallization layer and the intermediate metallization layer. Each of the half bridge circuits includes a first circuit node, a second circuit node, and a third circuit node, a controllable first semiconductor switch and a controllable second semiconductor switch. The controllable first semiconductor switch has a first main contact electrically connected to the first circuit node, a second main contact electrically connected to the third circuit node, and a gate contact for controlling an electric current between the first main contact and the second main contact. Accordingly, the controllable second semiconductor switch has a first main contact electrically connected to the second circuit node, a second main contact electrically connected to the third circuit node, and a gate contact for controlling an electric current between the first main contact and the second main contact. The first semiconductor switch and the second semiconductor switch of each of the half bridge circuits are arranged on that side of the first metallization layer facing away from the second insulation layer. The bonding wire is directly bonded to the intermediate metallization layer at a first bonding location.

BRIEF DESCRIPTION OF THE DRAWINGS

The embodiments of the present application can be better understood with reference to the following drawings and description. The components in the figures are not necessarily to scale, instead emphasis being placed upon illustrating the principles of the various embodiments. Moreover, in the figures, like reference numerals designate corresponding parts. In the drawings:

FIG. 2 is a circuit diagram of a 2-phase bridge that is formed of two half bridges as illustrated in FIG. 1A.

FIG. 3 is a circuit diagram of a 3-phase bridge that is formed of three half bridges as illustrated in FIG. 1A.

FIG. 4 illustrates a vertical cross section through a semiconductor arrangement that comprises a number of half bridges according to a first embodiment.

FIG. 5 illustrates a vertical cross section through a semiconductor arrangement that comprises a number of half bridges according to a second embodiment.

FIG. 6 illustrates a vertical cross section through a semiconductor arrangement that comprises a number of half bridges according to a third embodiment.

FIG. 7 illustrates a vertical cross section through a semiconductor arrangement that comprises a number of half bridges according to a fourth embodiment.

DETAILED DESCRIPTION

In the following Detailed Description, reference is made to the accompanying drawings, which form a part thereof, and in which is shown by way of illustration specific embodiments in which the application may be practiced. In this regard, directional terminology, such as "top", "bottom", "front", "back", "leading", "trailing" etc., is used with reference to the orientation of the FIGs being described. Because components of embodiments can be positioned in a number of different orientations, the directional terminology is used for purposes of illustration and is in no way limiting. It is to be understood that other embodiments may be utilized and structural or logical changes may be made without departing from the scope of the present application. The following detailed description, therefore, is not to be taken in a limiting sense, and the scope of the present application is defined by the appended claims. It is to be understood that the features of the various exemplary embodiments described herein may be combined with each other, unless specifically noted otherwise.

Figure 1A:
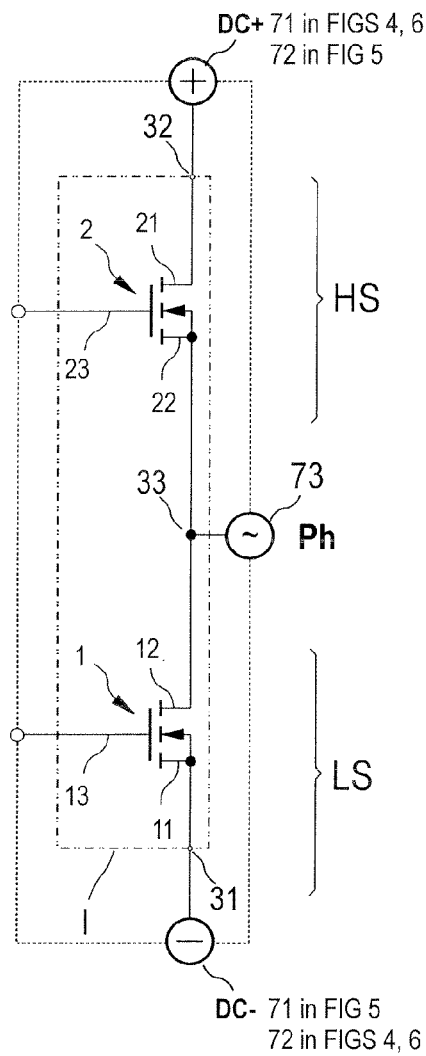
FIG. 1A is a circuit diagram of a half bridge that is formed of a series connection of two MOSFETs.

Referring now to FIG. 1A there is illustrated a circuit diagram of a half bridge I with a controllable first semiconductor switch 1 ("low sides switch", LS, implemented in a first semiconductor chip) and a controllable second semiconductor switch 2 (high side switch", HS, implemented in a second semiconductor chip) connected in series. The half bridge circuit has a first circuit node 31, a second circuit node 32 and a third circuit node 33.

The controllable first semiconductor switch 1 has a first main contact 11 electrically connected to the first circuit node 31, a second main contact 12 electrically connected to the third circuit node 33, and a gate contact 13 for controlling an electric current between the first main contact 11 and the second main contact 12. The controllable second semiconductor switch 2 has a first main contact 21 electrically connected to the second circuit node 32, a second main contact 22 electrically connected to the third circuit node 33, and a gate contact 23 for controlling an electric current between the first main contact 21 and the second main contact 22.

The gate contact 13 of the first semiconductor switch 1 may simply be used to switch an electric current between the first main contact 11 and the second main contact 12 ON or OFF. However, the gate contact 13 may also be used to adjust an electric current between the first main contact 11 and the second main contact 12 to an arbitrary value between substantially 0 A (Ampere) if the first semiconductor switch 1 is switched OFF and a maximum current that establishes if the first semiconductor switch 1 is switched ON. The phrase "substantially 0 A" is intended to mean "0 A except of an unavoidable residual current".

Accordingly, the gate contact 23 of the second semiconductor switch 2 may simply be used to switch an electric current between the first main contact 21 and the second main contact 22 ON or OFF. However, the gate contact 23 may also be used to adjust an electric current between the first main contact 21 and the second main contact 22 to an arbitrary value between substantially 0 A if the second semiconductor switch 2 is switched OFF and a maximum current that establishes if the second semiconductor switch 2 is switched ON.

In many applications, the half bridge may be supplied with electric power, for instance, with a DC link voltage. To this, the first circuit node 31 can be provided with a negative supply potential (DC−) and the second circuit node 32 with a positive supply potential (DC+). For receiving the positive and negative supply potentials DC+ and DC−, respectively, the arrangement includes a first terminal 71 and a second terminal 72. It is to be noted that in some embodiments, the first terminal 71 serves to receive a positive supply potential DC+ and the second terminal 72 serves to receive a negative supply potential DC−, and that in other embodiments the first terminal 71 serves to receive a negative supply potential DC− and the second terminal 72 serves to receive a positive supply potential DC+.

During operation, the first and second semiconductor switches 1, 2 are alternately switched ON and OFF. That is, in a first switching state, the second semiconductor switch 2 is in an OFF state if the first semiconductor switch 1 is in an ON state. Accordingly, in a second switching state, the first semiconductor switch 1 is in an OFF state if the second semiconductor switch 2 is in an ON state. When switching from the first switching state to the second switching state, or, reversely, from the second to the first switching state, between the first and second switching state there is an intermediate state in which both the first and semiconductor switches 1, 2 are switched OFF for a short time in order to avoid a short circuit between DC+ and DC−, or if a load connected to a the third circuit node 33 is to be switched off. Consequently, during normal switching operation of the half bridge I, the third circuit node 33 is alternately connected to either the positive or negative supply voltage DC+ or DC−, respectively.

In the half bridge I of FIG. 1A, the controllable first and second semiconductor switches 1, 2 are MOSFETs. Instead or in addition to MOSFETs, any other type of controllable first and/or semiconductor switch 1, 2 like IGBTs, JFETs, thyristors etc. may be used. The first and second semiconductor switch 1, 2 may be of identical type, that is, two MOSFETs, two IGBTs, two JFETs etc. Alternatively, any different types of controllable semiconductor switches 1 and 2 may also be connected in series.

Further, in case the controllable semiconductor switches 1 and 2 are field effect transistors, both controllable semiconductor switches 1 and 2 may be n-channel types, or p-channel types. However, it is also possible to use an n-channel type as the first semiconductor switch 1 and a p-channel type as the second semiconductor switch 2, or, vice versa, a p-channel type as the first semiconductor switch 1 and an n-channel type as the second semiconductor switch 2.

Figure 1B:
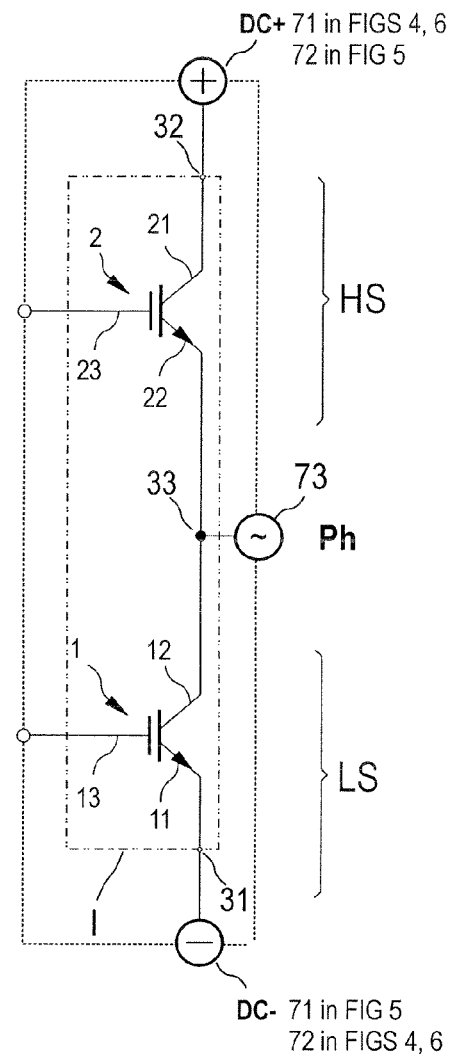
FIG. 1B is a circuit diagram of a half bridge that is formed of a series connection of two IGBTs.

As a further example of a half bridge, FIG. 1B shows a half bridge I that includes two IGBTs 1, 2 connected in series.

FIG. 2 is a circuit diagram of a 2-phase bridge that is formed of two half bridges I and II connected to common terminals 71, 72. Accordingly, FIG. 3 is a circuit diagram of a 3-phase bridge that is formed of three half bridges I, II and III connected to common terminals 71, 72. In any arrangement with at least one half bridge I, II, III, the common terminals 71, 72 serve to commonly connect all half bridges I, II, III to supply potentials DC+ and DC−.

Each of the half bridges I and II of FIG. 2 and each of the half bridges I, II and III of FIG. 3 may have the structure of the half bridge I as illustrated in FIG. 1A. Alternatively, a 2-phase bridge or a 3-phase bridge could be formed using two or three half bridges according to FIG. 1B instead of the half bridges according to FIG. 1A. Further, half bridges formed of arbitrary series connections of any other controllable semiconductor switches as described with reference to FIGS. 1A and 1B may also be used.

In the circuit arrangements of FIGS. 1A and 1B, N=1. In the circuit arrangement of FIG. 2, N=2, and in the circuit arrangement of FIG. 3, N=3. However, N may also be more than or equal to 4. Generally, N is an integer with $N \geq 1$, $N \geq 2$ or $N \geq 3$.

If the circuit arrangement includes at least two half bridges I, II, III ($N \geq 2$), the first circuit nodes 31 of all half bridges I, II, III of the circuit arrangement may be electrically connected to one another, and the second circuit nodes 32 of all half bridges I, II, III of the circuit arrangement may be electrically connected to one another. This allows for connection of all half bridges I, II, III of the circuit arrangement to common supply potentials DC+ and DC−. In the same manner, a circuit arrangement that includes four or more such half bridges simply may be achieved by adding one or more additional half bridges. Each of the additional half bridges may have any of the half bridge structures described above and be connected to the common first and second supply terminals 71 and 72.

FIG. 4 is a vertical cross section through a semiconductor arrangement that comprises at least two half bridges I, II, III according to a first embodiment. The circuit of the arrangement corresponds to the circuit diagram described with reference to FIG. 3. The semiconductor arrangement includes a circuit carrier 5 that has a first metallization layer 41, a second metallization layer 82, an intermediate metallization layer 81 arranged between the first metallization layer 41 and the second metallization layer 82, a first insulation layer 83 arranged between the intermediate metallization layer 81 and the second metallization layer 82, and a second insulation layer 43 arranged between the first metallization 41 and the intermediate metallization layer 81.

The circuit carrier 5 includes a number of sub-carriers 9 which are arranged on a common base carrier 8. The common base carrier 8 includes the intermediate metallization layer 81, the second metallization layer 82, and the first insulation layer 83. The intermediate metallization layer 81 and the second metallization layer 82 are electrically insulated from one another. The intermediate metallization layer 81 may be a closed, non-perforated metal layer. In order to improve the heat dissipation from the first and second semiconductor switches 1, 2, a heat sink may be attached to that side of the second metallization layer 82 facing away from the intermediate metallization layer 81.

The first insulation layer 83 is a closed continuous dielectric layer and free of electrically conductive vias. The sub-carriers 9 are arranged on that side of the intermediate metallization layer 81 facing away from the second metallization layer 82. Each of the sub-carriers 9 includes a first metallization 91, a dielectric 93, and an optional second metallization 92. Each of the first metallizations 91 may have a conductor structure with conductive lines. The first metallizations 91 of all sub-carriers 9 together form the first metallization layer 41. Accordingly, the dielectrics 93 of all sub-carriers 9 together form the second insulation layer 43.

According to one embodiment, each of the half bridge circuits I, II, III is arranged on another one of the sub-carriers 9. In particular, both the first and second semiconductor switches 1, 2 of each half bridge circuit I, II, III may be arranged on a common sub-carrier 9 of the respective half bridge circuit I, II, III. To this, the first and second semiconductor switches 1, 2 which may be semiconductor chips, may be soldered, sintered or electrically conductively adhered to the first metallization 91 of the respective sub-carrier 9 using connection layers 15, for instance, solder layers, sintered layers that include a noble metal like silver etc., or adhesive layers. As each of the semiconductor chips includes a first or second semiconductor switch having first and second main contacts and a gate contact, each of the semiconductor chips requires three contacts.

An arrangement that has a base substrate 8 and one or more individual sub-carriers 9 may be produced by equipping each of the sub-carriers 9 with the respective first and second semiconductor chips 1, 2 and optionally with the respective second connection lug 72. Also optionally, the first and second semiconductor chips 1, 2 may be electrically conductive interconnected using electrically conductive connection elements 7 like bonding wires, ribbons, metal sheets etc. All connection elements designated with reference numerals "7" may optionally be mounted on the respective sub-carrier 9 before that sub-carrier 9 is mounted onto the base carrier 8. After having been pre-equipped with at least some of the mentioned elements, the sub-carriers 9 may be mounted onto the base substrate 8. To this, the second metallization 92 of the respective sub-carrier 9 may be joined to the intermediate metallization layer 81 for instance by soldering, sintering or adhering. As a result of such a connection process, respective connection layers 45 join the sub-carriers 9 to the intermediate metallization layer 81. However, the connection 45 layers between the sub-carriers 9 and the intermediate metallization layer 81 are optional. Instead, the second metallizations 92 of the sub-carriers could be directly joined to the intermediate metallization layer 81, for instance by direct copper-to-copper bonding.

Alternatively, the sub-carriers 9 may be first mounted to the common base carrier 8 and then equipped with the respective elements using connection layers 45 as explained above, or direct copper-to-copper bonding without additional connection layers 45.

It should be noted that in FIG. 4 and the following figures as well, the electrical connections of the gate contacts are suppressed. However, in any embodiment, a gate contact of a semiconductor chip may be arranged either on that side of the semiconductor chip facing the circuit carrier 5 or on that side facing away from the circuit carrier 5. In an arrangement with a first semiconductor chip that includes a first semiconductor switch 1 and with a second semiconductor chip that includes a second semiconductor switch 2, in which the first and second semiconductor switch 1 and 2 form a half bridge circuit I, II, III, the first and second semiconductor chip may be arranged on the circuit carrier 5 in such a manner that the gate contacts 13, 23 of both the first and second semiconductor switches 1, 2 are arranged on the sides of the respective first and second semiconductor chip facing the circuit carrier 5, or, alternatively, in such a manner that the gate contacts 13, 23 of both the first and second semiconductor switches 1, 2 are arranged on the sides of the respective first and second semiconductor chip facing away from the circuit carrier 5. It is further possible that the gate contact 13 of the first semiconductor switch 1 is arranged on that side of the first semiconductor chip facing the circuit carrier 5 and that the gate contact 23 of the second semiconductor switch 2 is arranged on that side of the second semiconductor chip facing away from the circuit carrier 5. Vice versa, it is possible that the gate contact 13 of the first semiconductor switch 1 is arranged on that side of the first semiconductor chip facing away from the circuit carrier 5 and that the gate contact 23 of the second semiconductor switch 2 is arranged on that side of the second semiconductor chip facing the circuit carrier 5. Any of the described alternatives may apply to any half bridge circuit I, II, III of the arrangement, independently from the structure of the other half bridge circuits of the arrangement.

It should further be noted that each of such a first and second semiconductor chip may be a "vertical" semiconductor chip with the first and second main contacts 11/12 and 21/22, respectively, arranged on opposing sides of the respective semiconductor chip 1, 2. However, in other embodiments also "lateral" semiconductor chips may also be used.

In the arrangement of FIG. 4, the intermediate metallization layer 81 serves to distribute a positive supply voltage DC+ to each of the half bridge circuits I, II, III. For this purpose, a positive supply voltage DC+ may be provided via a first connection lug 71 which is electrically connected to the intermediate metallization layer 81. To this, the first connection lug 71 may be soldered or sintered to the intermediate metallization layer 81 using a connection layer 75, which, for instance may be a solder layer, or a sinter layer that includes a noble metal like silver etc. Alternatively, the first connection lug 71 could be directly welded to the intermediate metallization layer 81. In this case, the connection layer 75 is not required.

In order to electrically connect each of the half bridge circuits I, II, III to the intermediate metallization layer 81, bonding wires 6 may be used. For instance, a bonding wire 6 may be made of copper or of aluminum, or of at least 90 atom % of copper, or of at least 90 atom % of aluminum.

As illustrated in FIG. 4, such a bonding wire 6 may be bonded to the intermediate metallization layer 81 at a first bonding location 61, and optionally to the first metallization 91 of one of the sub-carriers 9 at a second bonding location 62. At the first bonding locations 61, the material of the bonding wire 6 is in physical contact with the material of the intermediate metallization layer 81. Accordingly, at the second bonding locations 62, the material of the bonding wire 6 is in physical contact with the material of the first metal layer 41.

In case there are two or more sub-carriers 9, at least one of the first bonding locations 61 may be located between two adjacent sub-carriers 9. The respective two adjacent sub-carriers 9 may be spaced distant from one another. The respective distance is d. For instance, the distance d may be less than or equal to 30 mm and/or at least 3 mm.

In the embodiment illustrated in FIG. 4, the intermediate metallization layer 81 is electrically connected to the first main contact 21 of the second semiconductor switch 2, that is, to the second circuit node 32 of the respective half bridge circuit I, II, III. The first main contact 21 of the second semiconductor switch 2 is located on that side of the second semiconductor switch 2 facing towards the circuit carrier 5.

In order to connect the individual half bridge circuits I, II, III to a negative supply potential DC−, second connection lugs 72 are provided. Each of the second connection lugs 72 is electrically connected to the first main contact 11 of the first semiconductor switch 1 of another one of the sub-carriers 9, that is, to the first circuit node 31 of the respective half bridge circuit I, II, III. To this, the second connection lugs 72 may be soldered or sintered to the first metallization 91 of the respective sub-carrier 9 using a connection layer 75, which, for instance may be a solder layer, or a sinter layer that includes a noble metal like silver etc. Alternatively, the second connection lugs 72 could be directly welded to the first metallization 91 of the respective sub-carrier 9. In FIG. 4, the first main contact 11 of the first semiconductor switch 1 is located on that side of the first semiconductor switch 1 facing away from the circuit carrier 5. In order to electrically interconnect the second connection lugs 72 to a common supply potential which in this embodiment is DC−, a bus bar 72a is provided that electrically connects the second connection lugs 72.

Further, for each of the half bridge circuits I, II, III, a third connection lug 73 is provided. Each of the third connection lugs 73 is electrically connected to the third circuit node 33 of another one of the half bridge circuits I, II, III, that is, to another one of the sub-carriers 9. To this, the third connection lugs 73 may be soldered or sintered to the first metallization 91 of the respective sub-carrier 9 using a connection layer 75, which, for instance may be a solder layer, or a sinter layer that includes a noble metal like silver etc. Alternatively, the third connection lugs 73 could be directly welded to the first metallization layer 41. In FIG. 4, the first main contact 11 of the first semiconductor switch 1 is located on that side of the first semiconductor switch 1 facing away from the circuit carrier 5. The third connection lugs 73 serve as phase outputs Ph. For instance, the phase outputs Ph may be connected to a load like a motor etc.

According to another embodiment illustrated in FIG. 5, the intermediate metallization layer 81 may alternatively serve to distribute a negative supply voltage DC− to each of the half bridge circuits I, II, III. In this case, the negative supply voltage DC− may be provided via the first connection lug 71 which is electrically connected to the intermediate metallization layer 81 as described with reference to FIG. 4. In order to electrically connect each of the half bridge circuits I, II, III to the intermediate metallization layer 81, bonding wires 6 may be used. As illustrated in FIG. 5, such a bonding wire 6 may be bonded to the intermediate metallization layer 81 at a first bonding location 61, and optionally to that side of the first semiconductor switch 1 facing away from the circuit carrier 5 at a second bonding location 62.

In case there are two or more sub-carriers 9, at least one of the first bonding locations 61 may be located between two adjacent sub-carriers 9. The respective two adjacent sub-carriers 9 may be spaced distant from one another by a distance d which may be in the same range as mentioned before with reference to FIG. 4.

In order to electrically interconnect the second connection lugs 72 to a common supply potential which in this embodiment is DC+, a bus bar 72a is provided that electrically connects the second connection lugs 72.

A further embodiment is illustrated in FIG. 6 that differs from the embodiment of FIG. 4 only in that the sub-carriers 9 do not have second metallizations 92 (see FIG. 4). Instead, each dielectric 93 is directly bonded to and in physical contact with the intermediate metallization layer 81. As already described with reference to FIG. 4, the sub-carriers 9 may be spaced distant from one another by a distance d which may be in the same range as mentioned before with reference to FIG. 4.

The arrangement of FIG. 5 could be modified in the same manner, that is, instead of providing second metallizations 92 and connection layers 45, each of the dielectrics 93 could be directly bonded to the intermediate metallization layer 81. The result is illustrated in FIG. 7.

In any embodiment, in particular in the embodiments explained above with reference to the drawings, the first metallization layer 41, the second metallization layer 82, the intermediate metallization layer 81 and the optional second metallization 42 may have, independently from one another, one or more of the following features in arbitrary combinations:

(a) A thickness of at least 0.1 mm.
(b) A thickness of less than or equal to 0.8 mm.
(c) A material that is made of copper or that comprises at least 90 weight % of copper or that is made of aluminum or that comprises at least 90 weight % of aluminum.

Then, in any embodiment, in particular in the embodiments explained above with reference to the drawings, the first insulation layer 83 and the second insulation layer 43 may have, independently from one another, one or more of the following features in arbitrary combinations:

(a) A thickness of at least 0.2 mm.
(b) A thickness of less than or equal to 2 mm.
(c) No electrically conductive via.
(d) A material that is made of ceramics. For instance, the material may include or consists of one more of the following ceramic materials: aluminum oxide ($Al_2O_3$, alumina); aluminum nitride (AlN); silicon nitride ($Si_3N_4$); zircon oxide ($ZrO_2$); aluminum titanate ($Al_2TiO_5$); sintered silicon carbide (SSiC); reaction bonded silicone carbide (SiSiC).

Further, in special embodiments having one or more sub-carriers 9, the sub-carriers 9 may be DBC substrates (DBC=direct bonded copper), AMB substrates (AMB=active metal brazed) or DAB substrates (DAB=direct aluminum bonded). In such a DBC substrate, the second insulation layer 43 consists of alumina ($Al_2O_3$). The first metallization 41 and the optional second metallization 42 are copper layers that were directly bonded to the alumina of the second insulation layer 43 at high pressure and at high temperatures of about 1064° C.

Accordingly, the base substrate 8 may be a DBC substrates, an AMB substrate or a DAB substrates. In case of a DBC substrate, the first insulation layer 83 consists of alumina (Al₂O₃) and the intermediate metallization layer 81 and the second metallization layer 82 are copper layers that were directly bonded to the alumina of the first insulation layer 83 at high pressure and at high temperatures of about 1064° C.

In other embodiments in which the sub-carriers 9 do not have second metallizations 92, the circuit carrier 5 may be a multilayer DBC substrate in which the first insulation layer 83 and the second insulation layer 43 consist of alumina, in which the first metallization layer 41 and the intermediate metallization layer 81 are directly copper bonded to the second insulation layer 43, and in which the intermediate metallization layer 81 and the second metallization layer 82 are directly copper bonded to the first insulation layer 83.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement comprising:
    a circuit carrier comprising a first metallization layer, a second metallization layer, an intermediate metallization layer arranged between the first metallization layer and the second metallization layer, a first insulation layer arranged between the intermediate metallization layer and the second metallization layer, and a second insulation layer arranged between the first metallization layer and the intermediate metallization layer;
    a bonding wire;
    at least N half bridge circuits wherein N≧1, each half bridge circuit comprising:
        a first circuit node, a second circuit node and a third circuit node;
        a controllable first semiconductor switch comprising a first main contact electrically connected to the first circuit node, a second main contact electrically connected to the third circuit node, and a gate contact for controlling an electric current between the first main contact and the second main contact;
        a controllable second semiconductor switch comprising a first main contact electrically connected to the second circuit node, a second main contact electrically connected to the third circuit node, and a gate contact for controlling an electric current between the first main contact and the second main contact;
    wherein
        the first semiconductor switch and the second semiconductor switch of each of the half bridge circuits are arranged on that side of the first metallization layer facing away from the second insulation layer;
        the bonding wire is directly bonded to the intermediate metallization layer at a first bonding location.

2. The semiconductor arrangement as claimed in claim 1 wherein, at the first bonding location, the material of the bonding wire is in physical contact with the material of the intermediate metallization layer.

3. The semiconductor arrangement as claimed in claim 1 wherein the bonding wire is directly bonded to the first metallization layer at a second bonding location.

4. The semiconductor arrangement as claimed in claim 3 wherein, at the second bonding location, the material of the bonding wire is in physical contact with the material of the first metallization layer.

5. The semiconductor arrangement as claimed in claim 1 wherein the bonding wire is directly bonded to that side of the first semiconductor switch facing away from the circuit carrier at a second bonding location.

6. The semiconductor arrangement as claimed in claim 1 further comprising a first connection lug electrically connected to the intermediate metallization layer.

7. The semiconductor arrangement as claimed in claim 6 wherein the first connection lug is electrically connected either to the first main contact of the first semiconductor switch or to the first main contact of the second semiconductor switch.

8. The semiconductor arrangement as claimed in claim 6 further comprising a second connection lug wherein the first connection lug is electrically connected to the first main contact of the first semiconductor switch and the second connection lug is electrically connected to the first main contact of the second semiconductor switch.

9. The semiconductor arrangement as claimed in claim 8 wherein
    the first connection lug is electrically connected to that side of the first semiconductor switch facing away from the circuit carrier; and
    the second connection lug is electrically connected to that side of the second semiconductor switch facing towards the circuit carrier.

10. The semiconductor arrangement as claimed in claim 6 further comprising a second connection lug wherein the first connection lug is electrically connected to the first main contact of the second semiconductor switch and the second connection lug is electrically connected to the first main contact of the first semiconductor switch.

11. The semiconductor arrangement as claimed in claim 10 wherein
    the first connection lug is electrically connected to that side of the second semiconductor switch facing towards the circuit carrier; and
    the second connection lug is electrically connected to that side of the first semiconductor switch facing away from the circuit carrier.

12. The semiconductor arrangement as claimed in claim 1 wherein
    N≧2 or N≧3;
    each of the half bridge circuits is arranged on another one of N sub-carriers which are part of the circuit carrier;
    each of the N sub-carriers comprises a first metallization and a dielectric;
    both the first and second semiconductor switches of each of the N half bridge circuits are arranged on that side of the first metallization of the respective sub-carrier facing away from the dielectric; and
    the first bonding location is located between two adjacent ones of the sub-carriers which are spaced distant from one another.

13. The semiconductor arrangement as claimed in claim 12 wherein the first metallizations of the sub-carriers of the N half bridge circuits together form the first metallization layer.

14. The semiconductor arrangement as claimed in claim 12 further comprising a connection layer wherein
- each of the N sub-carriers comprises a second metallization arranged on that side of the dielectric of the respective sub-carrier facing away from the first metallization of the respective sub-carrier;
- the connection layer is arranged between the second metallization of the sub-carrier of each of the N half bridge circuits and the intermediate metallization layer and electrically connects and mechanically joins the second metallization of each of the N sub-carriers to the intermediate metallization layer.

15. The semiconductor arrangement as claimed in claim 12 wherein the material of the dielectric of each of the N sub-carriers is in physical contact with the material of the intermediate metallization layer.

16. The semiconductor arrangement as claimed in claim 12 wherein the distance between the two adjacent ones of the sub-carriers is at least 3 mm.

17. The semiconductor arrangement as claimed in claim 12 wherein the distance between the two adjacent ones of the sub-carriers is less than or equal to 30 mm.

18. The semiconductor arrangement as claimed in claim 1 wherein each one of the first, second and intermediate metallization layers has a thickness of at least 0.1 mm.

19. The semiconductor arrangement as claimed in claim 1 wherein each one of the first, second and intermediate metallization layers has a thickness of less than or equal to 0.8 mm.

20. The semiconductor arrangement as claimed in claim 1 wherein each one of the first, second and intermediate metallization layers
- is made of copper; or
- comprises at least 90 weight % of copper; or
- is made of aluminum; or
- comprises at least 90 weight % of aluminum.

21. The semiconductor arrangement as claimed in claim 1 wherein each one of the first and second insulation layers has a thickness of at least 0.2 mm.

22. The semiconductor arrangement as claimed in claim 1 wherein each one of the first and second insulation layers has a thickness of less than or equal to 2 mm.

23. The semiconductor arrangement as claimed in claim 1 wherein each one of the first and second insulation layers is made of ceramics.

24. The semiconductor arrangement as claimed in claim 1 wherein the intermediate metallization layer is a closed, non-perforated metal layer.

25. The semiconductor arrangement as claimed in claim 12 wherein none of the dielectric of the N sub-arrangements comprises a via that electrically connects the first metallization of the respective sub-arrangement and the intermediate metallization layer.

26. The semiconductor arrangement as claimed in claim 1 wherein the first insulation layer is a closed, non-perforated dielectric layer without any vias.

* * * * *

UNITED STATES PATENT AND TRADEMARK OFFICE
CERTIFICATE OF CORRECTION

PATENT NO. : 8,441,128 B2
APPLICATION NO. : 13/210453
DATED : May 14, 2013
INVENTOR(S) : Daniel Domes Page 1 of 1

It is certified that error appears in the above-identified patent and that said Letters Patent is hereby corrected as shown below:

In the Claims

Column 9, line 47 (claim 1, line 11) change "wherein $N \geqq 1$," to -- wherein $N \geq 1$ --

Column 10, line 56 (claim 12, line 3) change "$N \geqq 2$ or $N \geqq 3$;" to -- $N \geq 2$ or $N \geq 3$; --

Signed and Sealed this
Eighteenth Day of February, 2014

Michelle K. Lee
*Deputy Director of the United States Patent and Trademark Office*